(12) United States Patent
Crain

(10) Patent No.: US 9,490,968 B2
(45) Date of Patent: Nov. 8, 2016

(54) CDR VOTER WITH IMPROVED FREQUENCY OFFSET TOLERANCE

(71) Applicant: Cavium, Inc., San Jose, CA (US)

(72) Inventor: Ethan Crain, Northborough, MA (US)

(73) Assignee: Cavium, Inc., San Jose, CA (US)

( * ) Notice: Subject to any disclaimer, the term of this patent is extended or adjusted under 35 U.S.C. 154(b) by 165 days.

(21) Appl. No.: 14/192,100

(22) Filed: Feb. 27, 2014

(65) Prior Publication Data
US 2015/0244549 A1    Aug. 27, 2015

(51) Int. Cl.
| H04B 3/46 | (2015.01) |
| H03M 1/10 | (2006.01) |
| H04L 7/033 | (2006.01) |
| H03L 7/093 | (2006.01) |
| H03L 7/00 | (2006.01) |

(52) U.S. Cl.
CPC .................. *H04L 7/033* (2013.01); *H03L 7/00* (2013.01); *H03L 7/093* (2013.01)

(58) Field of Classification Search
CPC ............ H04L 7/033; H04L 25/03057; H04L 7/0008; H04L 1/0057; H04L 25/0292; H04L 27/2657
USPC .......................................... 375/226; 341/120
See application file for complete search history.

(56) References Cited

U.S. PATENT DOCUMENTS

| 6,212,248 B1* | 4/2001 | Hayashi ................ H03L 7/0891 327/157 |
| 6,265,996 B1* | 7/2001 | Duffy .................... H04J 3/0608 341/101 |
| 6,459,394 B1* | 10/2002 | Nadi ................... H03M 1/1004 341/120 |
| 7,020,227 B1* | 3/2006 | Wang .................... H04L 7/0337 375/261 |
| 8,634,509 B2 | 1/2014 | Crain et al. |
| 8,687,738 B1* | 4/2014 | Lee ......................... H04L 7/033 327/141 |
| 2001/0033407 A1* | 10/2001 | Cao ....................... H03K 19/215 398/55 |
| 2002/0009170 A1* | 1/2002 | Schmatz ................... H03L 7/07 375/371 |
| 2003/0034849 A1* | 2/2003 | Sanduleanu ......... H03K 3/0231 331/58 |
| 2004/0012448 A1* | 1/2004 | Bonhaus ................ H03L 7/093 331/17 |
| 2004/0124876 A1* | 7/2004 | Plants ................. G06F 11/1008 326/39 |
| 2005/0111537 A1* | 5/2005 | Sunter ............. G01R 31/31709 375/226 |

OTHER PUBLICATIONS

Chih-Kong Ken Yang, "Delay-Locked Loops—An Overview", *Phase-Locking in High-Performance Systems*, IEEE Press, Feb. 2003, pp. 13-22.
P. E. Allen, ECE 6440 Frequency Synthesizers, "Lecture 200—Clock and Data Recovery Circuits," Jun. 26, 2003, 16 pages.

* cited by examiner

*Primary Examiner* — Daniel Washburn
*Assistant Examiner* — Sarah Hassan
(74) *Attorney, Agent, or Firm* — Hamilton, Brook, Smith & Reynolds, P.C.

(57) ABSTRACT

An improved clock data recovery circuit is provided which provides lower bit error rates and faster locking times. In an embodiment, the circuit includes a voter having one or more voter inputs. The voter may generate up votes indicative of a recovered clock having a negative phase offset relative to a given voter input, or down votes indicative of the recovered clock having a positive phase offset. The circuit may include a comparator configured to output a phase adjustment signal and a tie signal. The circuit may further include an M-depth shift register and a multiplexer configured to select either the phase adjustment signal or an output from the shift register as a multiplexer output. The circuit may further include a flip-flop that generates a phase adjustment output signal. The shift register may receive the phase adjustment output signal at a data input of the shift register.

22 Claims, 9 Drawing Sheets

CDR VOTER WITH IMPROVED FREQUENCY OFFSET TOLERANCE

BACKGROUND

High-speed serial data may be transmitted without a clock signal. The process of Clock and Data recovery (CDR) is used to recover the clock and data. Receiving circuitry generates a clock from a matched reference clock, which is approximately a sub-harmonic of the recovered clock, and performs phase alignment based upon data transitions.

SUMMARY

In practice, the receive Clock and Data Recovery (CDR) circuitry has a significant impact on the PHY Bit Error Rate (BER). Existing CDR methods use voting, a form of filtering noise in the edge measurements, in order to determine whether to increase or decrease the local frequency to obtain a recovered clock.

However, existing CDR voting methods are deficient because they do not adequately handle voting tie situations in the presence of large frequency offsets, which may occur for several reasons, such as insufficient edge transitions due to noise or a large number of consecutive identical digits (CID). The existing approaches are further deficient because the CDR may stop tracking the received clock frequency, bit errors may occur, the locking time may be delayed, or even worse, the CDR may lose frequency lock. There is a need for an approach that overcomes these deficiencies.

The present approach overcomes these deficiencies by saving the most recent transition information, and applying that information during the period where tie votes occur. The present approach results in lower BER and greatly improved CDR locking time.

In one embodiment, a circuit includes a voter having one or more voter inputs. The voter may generate, for each given voter input, an up vote indicative of a recovered clock having a negative phase offset relative to the given voter input, or a down vote indicative of the recovered clock having a positive phase offset relative to the given voter input. The circuit may include a comparator coupled to the voter configured to output a phase adjustment signal and a tie signal based upon the up and down votes generated.

The circuit may include a shift register including one or more flip-flops, such as, but not limited to, an M-depth shift register where M is the number of flip-flops in the shift register. The circuit may also include a multiplexer coupled to the comparator and the shift register. The multiplexer may be configured to select either the phase adjustment signal or an output from the shift register as a multiplexer output, based on the tie signal. The circuit may also include a flip-flop receiving the multiplexer output at a data input of the flip-flop. The flip-flop may generate a phase adjustment output signal and the shift register may receive the phase adjustment output signal at a data input of the shift register.

The one or more voter inputs may comprise at least one of one or more data inputs and one or more edge inputs. The voter inputs may represent delayed samples of the received data.

An up vote may indicate that the recovered clock is early, relative to the received data on the given voter input. A down vote may indicate that the recovered clock is late, relative to the received data on the given voter input. An up vote may indicate that the recovered clock has a negative phase offset relative to the voter inputs (where the voter inputs may include, but are not limited to, receive data) and a down vote may indicate that the recovered clock has a positive phase offset relative to the voter inputs. However, the circuit is not so limited, and alternatively, an up vote may indicate that the recovered clock has a positive phase offset relative to the voter inputs and a down vote may indicate that the recovered clock has a negative phase offset relative to the voter inputs.

In one embodiment, when the sum of the up votes is greater than the sum of the down votes the recovered clock has a negative phase offset relative to the voter inputs the following parameters may be set: increment=1 and tie=0. In this embodiment, when the sum of the down votes is greater than the sum of the up votes the recovered clock may have a positive phase offset relative to the voter inputs and increment=0 and tie=0. In one embodiment, when the sum of the up votes and the sum of the down votes is equal, the recovered clock is in-phase with the voter inputs and increment=0 and tie=1. In another embodiment, when there are insufficient transitions to produce a vote, increment=0 and tie=1.

In another embodiment of the circuit, the shift register may include of two or more flip-flops. In a further embodiment, the voter may include two or more voter inputs. In yet another embodiment, the shift register may include at least as many flip-flops as a number of the one or more voter inputs. In an embodiment, the shift register may include at least twice as many flip-flops as a number of the one or more voter inputs.

In another embodiment, the shift register may include at least as many flip-flops as a number of received consecutive identical values at a given voter input. The number of consecutive identical values may be the maximum number of consecutive identical values known in the art for at least one of: 8 B/10 B encoding, 64 B/66 B encoding, PCI Express encoding, B8ZS encoding, HDB3 encoding, Manchester encoding, XB/YB encoding (where X is an integer and Y is a different integer), and other types of encoding, coding, or modulation.

In one embodiment, a circuit may include a shift register including one or more flip-flops. The circuit may include a multiplexer configured to select either a phase adjustment signal or an output from the shift register, as a multiplexer output based upon a tie signal. The circuit may also include a flip-flop receiving the multiplexer output at a data input of the flip-flop, the flip-flop generating a phase adjustment output signal, the shift register receiving the phase adjustment output signal at a data input of the shift register.

In one embodiment, the circuit may include a voting module having one or more voter inputs, the voting module generating the tie signal and the phase adjustment signal based upon a majority vote of phase offset for the one or more voter inputs relative to a recovered clock. The shift register may include two or more flip-flops. The voting module may include two or more voter inputs. The shift register may include at least as many flip-flops as a number of the one or more voter inputs. The shift register may include at least twice as many flip-flops as a number of the voter inputs. The shift register may include at least as many flip-flops as a number of received consecutive identical values at a given voter input. The voter inputs may comprise at least one of one or more data inputs and one or more edge inputs.

In one embodiment, a method may include receiving bit transition information for one or more bits and determining whether to increment, decrement, or keep unchanged a phase relationship of a phase interpolator, based upon the bit transition information. The method may further include generating a phase adjustment output, based upon the determination. The method may additionally include storing one or more sequential values of the phase adjustment output. The stored sequential values may reflect the phase adjustment history of the voter. The phase adjustment output may be generated directly from the stored sequential values of the phase adjustment output when the phase relationship is determined as unchanged.

In another embodiment, the method may include storing two or more sequential values of the phase adjustment output. The method may include receiving bit transition information for two or more bits. The number of the stored sequential values may be at least as many as a number of bits of the bit transition information. The number of the stored sequential values may be at least twice as many as a number of bits of the bit transition information. The method may also include storing at least as many sequential values as a number of consecutive identical values of the bit transition information.

The phase relationship determined as kept unchanged may be indicative of a recovered clock being locked to the bit transition information or indicative of the bit transition information being unavailable. For example, in one embodiment, a tie may occur either because the recovered clock is locked to the incoming data or because there is no data to vote on. One embodiment includes a voter with up/down/tie outputs and a no-vote flag in place of the tie signal, in order to distinguish between lock and a no vote.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
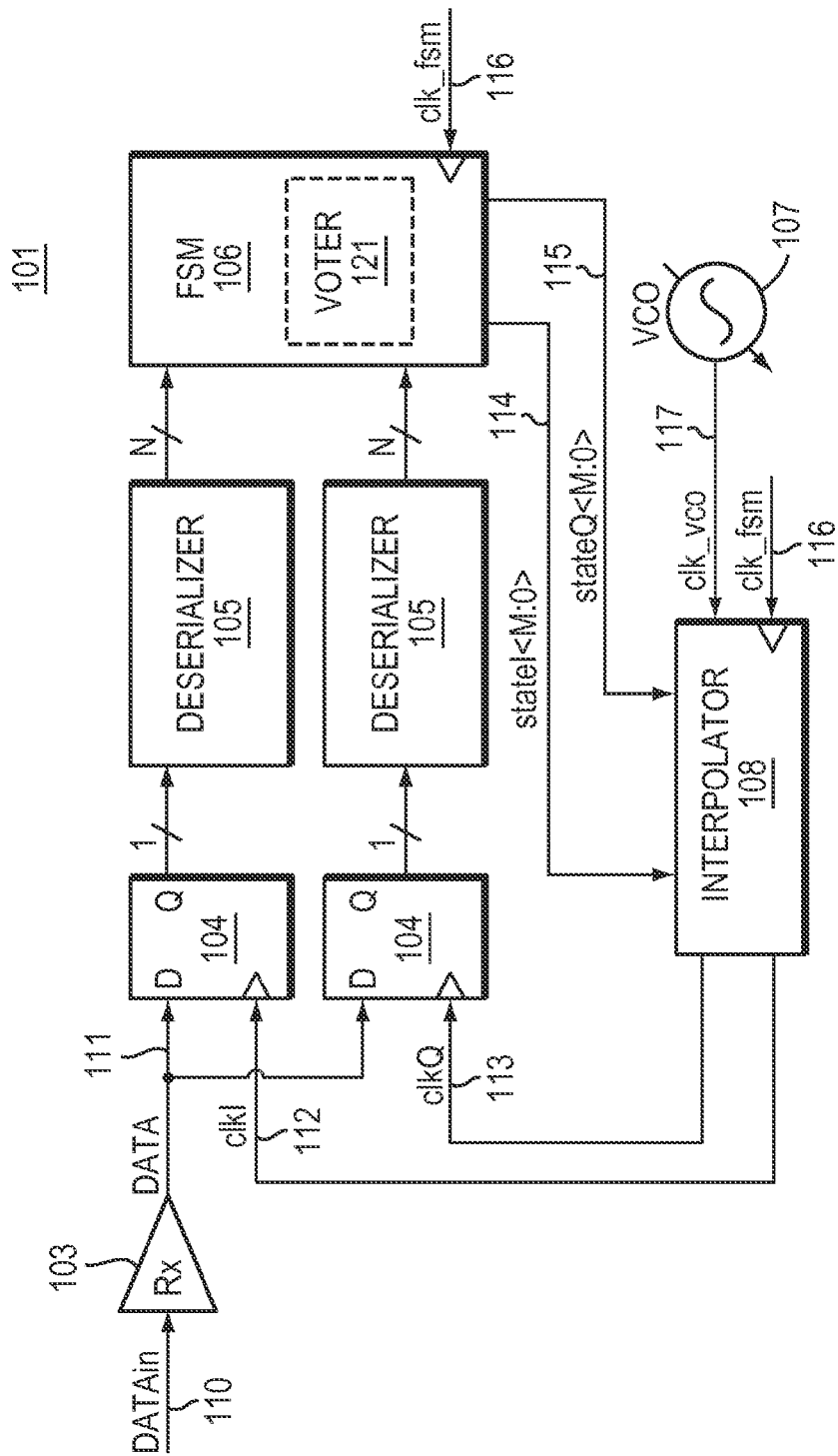
FIG. 1 is an example of a CDR Top Level Block Diagram showing the voter.

The Clock and Data Recovery (CDR) circuit used in the receive portion of a Serializer/Deserializer (SerDes) PHY, exhibited in FIG. 1, has a significant impact on the PHY Bit Error Rate (BER). As illustrated in FIG. 1, the CDR 101 receives serial data 110 and uses buffered data 111 after processing through a buffer 103. The CDR is commonly implemented as a Delay-Locked Loop (DLL) using a multi-phase voltage-controlled oscillator (VCO) 107 that generates a clock signal, clk_vco 117, as the local reference and a phase interpolator (PI) or interpolator 108, to adjust the local clock frequency 117 to match the received clock frequency. A Finite State Machine (FSM) 106 (including a voter 121) uses a combination of either serial data (received from flip-flops 104) or parallel received data (received from deserializers 105), edge information (associated with clkI 112) and/or data information (associated with clkQ 113) to control the phase interpolator states, stateI<M:0> 114 and stateQ<M:0> 115, to match the local clock frequency 117, the PI outputs clkI 112 (clkI 112 being considered as the recovered clock, clkI 112 being at approximately the same frequency as clk_vco 117) and clkQ 113, to the received clock frequency. The interpolator 108 and FSM 106 may also require an FSM clock 116 (clk_fsm) which may be a divided down version of the clk_vco 117 with an offset, or a divided down version of the clkI 112 or the clkQ 113.

Figure 2:
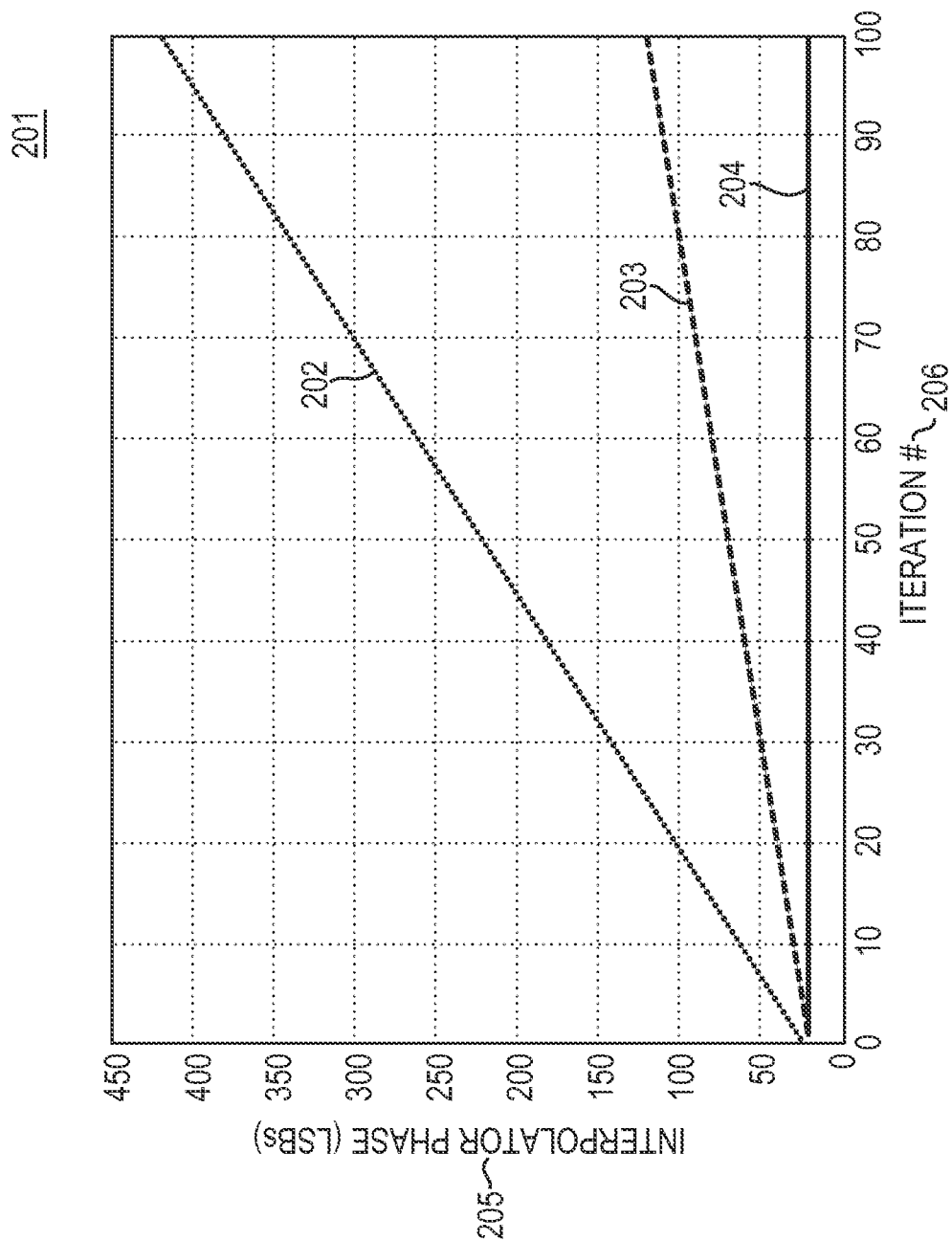
FIG. 2 illustrates the tracking performance of interpolator phase code versus iterations for various frequency offsets.

If the PI state is held constant, then it interpolates between two phases with a fixed weighting and the PI output frequency is the same as the local clock frequency. This case 201 is shown as the line 204 in FIG. 2 where the x-axis 206 is FSM iteration steps and the y-axis 205 is the PI state. However, if the incoming frequency is either higher or lower than the local frequency then a frequency offset exists and the FSM either decrements or increments the PI state, respectively, to accumulate additional negative or positive phase per FSM clock cycle and match the received clock frequency. The lines 202, 203 in FIG. 2 show the PI state over 100 FSM iterations for two different, non-zero frequency offsets where the slope of the lines is proportional to the magnitude of the frequency offset.

To reduce the impact of instantaneous noise and bit errors on the tracking performance of the CDR, the FSM generally filters the inputs over several bit times before updating the PI state. One common method of filtering is to perform a majority vote over some number of bits N, where the larger N is the more filtering occurs, to generate the PI control signal. However, occasional tie votes occur and there needs to be a method for handling this exception. A tie may occur for several reasons: even number of votes with little or no frequency offset; insufficient edge transitions due to noise or large number of consecutive identical digits (CID).

Figure 3:
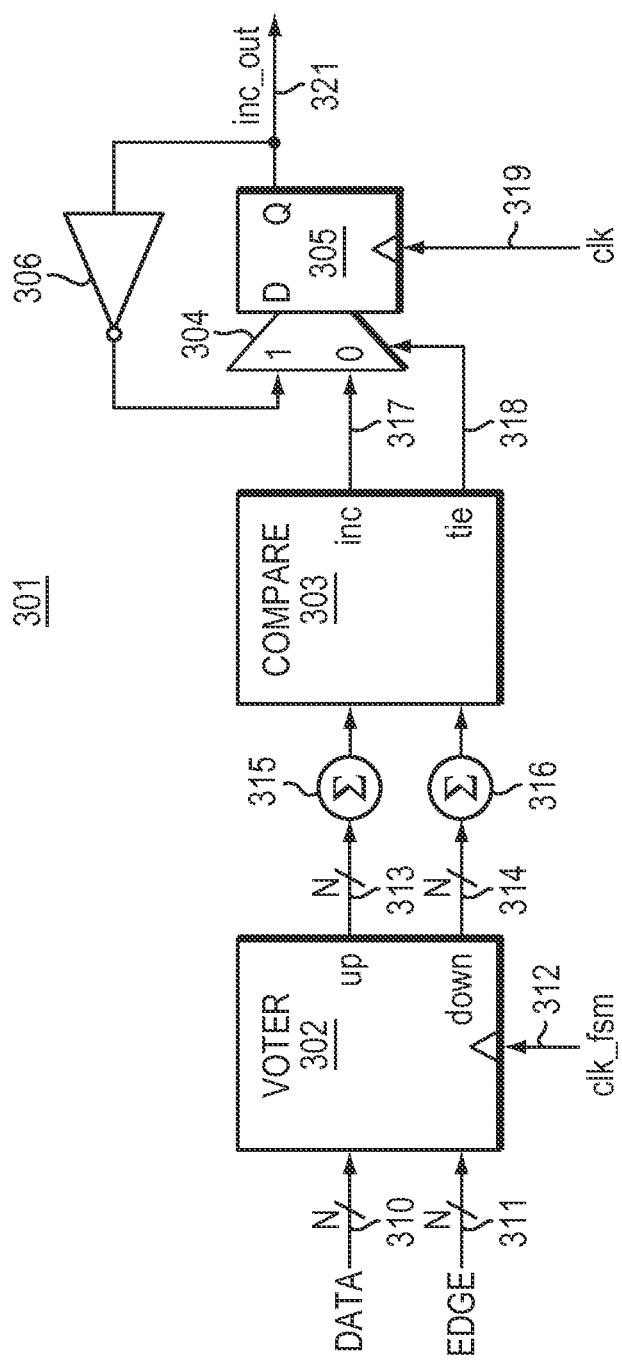
FIG. 3 is a block diagram of a circuit that inverts the vote in the case of a tie.
Figure 4:
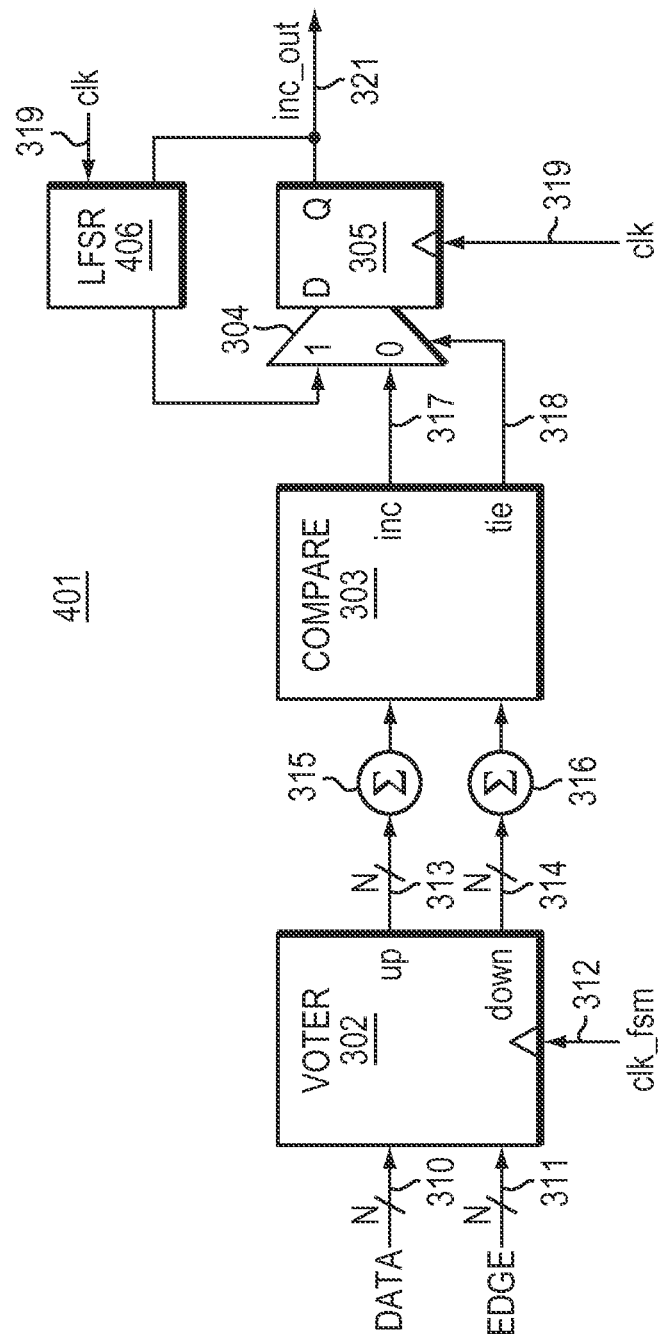
FIG. 4 is a block diagram of a circuit that takes the output of a linear feedback shift register (LFSR) as the current vote in the case of a tie.

There are several methods for handling tie votes and FIG. 3 (circuit 301) and FIG. 4 (circuit 401) show two common approaches. In both FIGS. 3 and 4 the voter 302 receives a clock clk_fsm 312 and N data 310 and/or N edge 311 bits that the vote is based on and creates up votes 313 and/or down votes 314 for each of the N bit transitions. The up/down votes are summed 315, 316 and compared 303 and INC 317, the new update to the PI state, is set high to increment the PI state and reduce the PI output frequency or low to decrement the PI state and increase the PI output frequency. The COMPARE 303 block also creates a TIE signal 318 that controls the mux input a multiplexer 304 that drives the final flop 305 (which is clocked by clk 319) to handle the case of a tie vote. The output of the final flop 305 is inc_out 321.

The first circuit 301, shown in FIG. 3, inverts 306 the prior vote as the current vote and the second circuit 401, shown in FIG. 4, takes the output of a Linear Feedback Shift Register (LFSR) 406 (also clocked by clk 319) as the current vote. Also, the multiplexer 304 select is based on the TIE signal 318, INC 317 is one input to the multiplexer 304 and the other input to the multiplexer 304 is either the inverter 306 output (in FIG. 3) or the LFSR 406 output (in FIG. 4).

For most cases these two methods are sufficient to provide a low BER for the PHY. If several consecutive tie votes occur and one of the previously proposed methods is employed, the CDR may either stop or slow down ramping the PI state because the ensemble average vote over several FSM iterations for both methods is zero. If the PI state does not ramp, the PI output frequency may be the local oscillator frequency. When a large frequency offset exists, which is not known a-priori, the FSM may either increment or decrement the PI state with large update values each evaluation cycle. If the PI stops tracking the received clock frequency bit errors may occur, or worse, the CDR may lose frequency lock.

Figure 5:
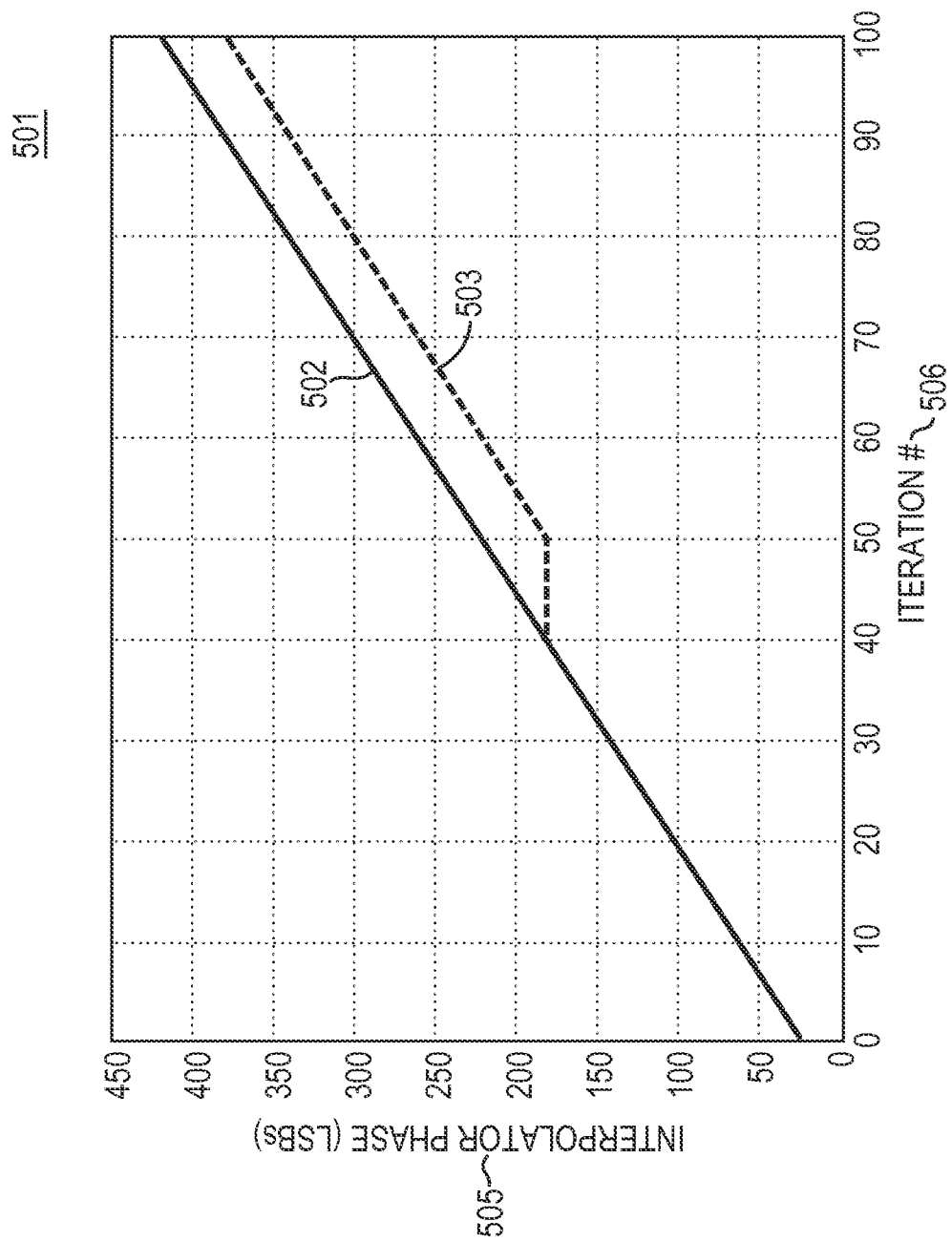
FIG. 5 illustrates the interpolator phase code versus number of iterations with either invert or LFSR for a vote tie breaker versus the required phase code to maintain frequency lock.

To better understand why the previous methods may cause bit errors, consider FIG. 5, which, similar to FIG. 2, shows the PI state versus FSM iteration for a non-zero frequency offset 501. The x-axis 506 is FSM iteration steps and the y-axis 505 is the PI state. The line 502 represents the ideal codes for the PI if it were to track the received clock frequency. If several successive tie votes occur, starting at iteration number 40, then the PI state stops ramping, as shown in line 503, until a new valid vote occurs. The PI state may oscillate some in this time if the LFSR output is not truly random, but the average vote and, therefore, the average change in interpolator state, is zero.

Figure 6:
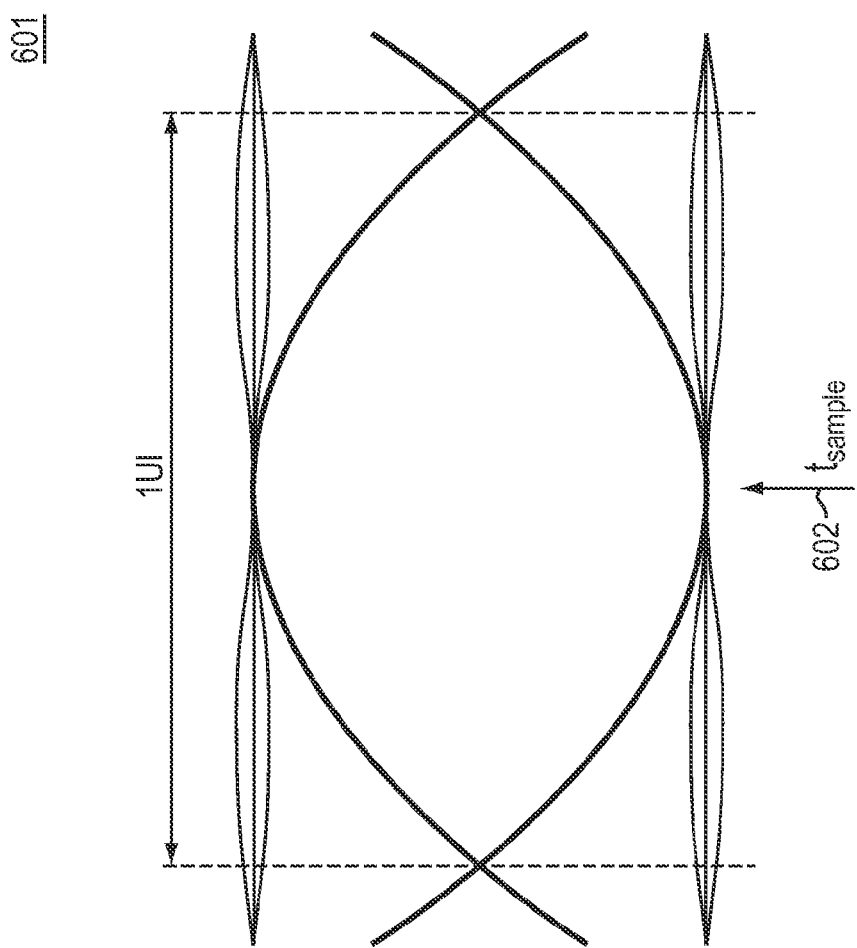
FIG. 6 is an example eye diagram showing ideal sampling time and impact of sampling clock phase error.

When valid votes return the phase error between the local and received clocks may be a large percentage of the clock phase, depending on the number of consecutive tie votes. If this phase error is large relative to the sampling clock period, $t_{sample}$ 602, then the sampling time shifts from the ideal point towards one of the data crossings, as shown in the eye diagram 601 of FIG. 6, potentially resulting in bit errors. FIG. 6 is an example eye diagram 601 showing ideal sampling time and impact of sampling clock phase error.

Figure 7:
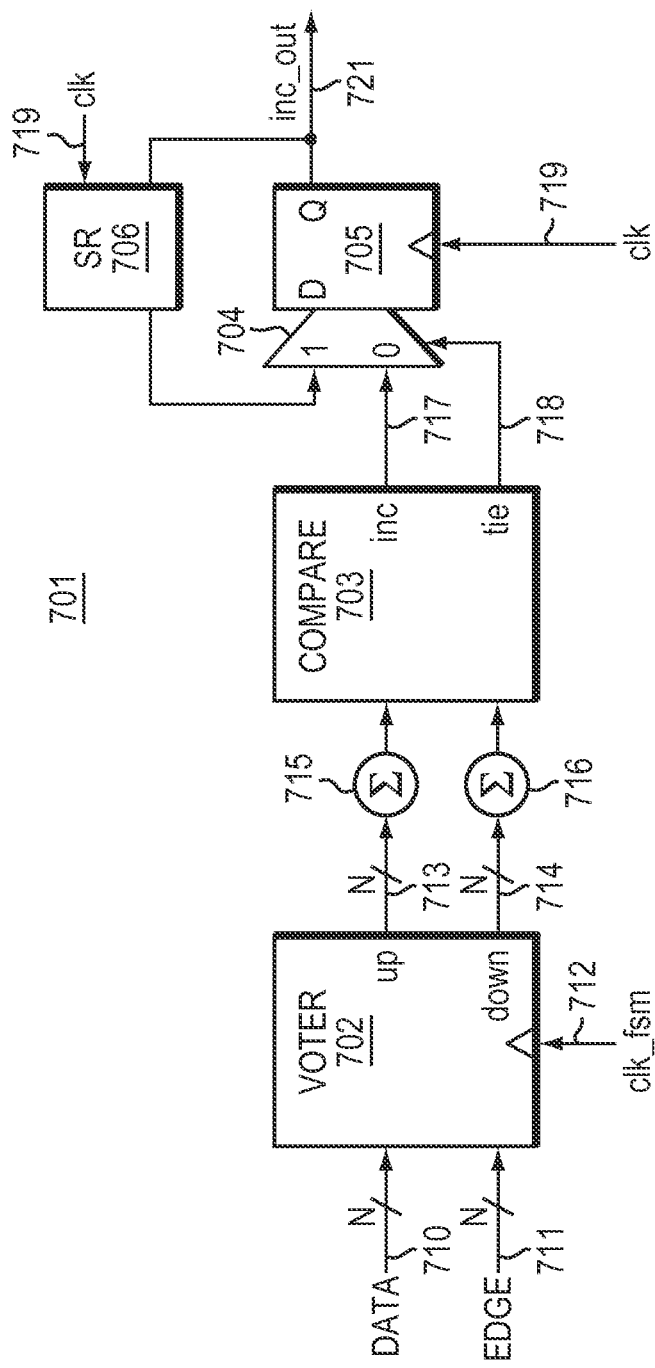
FIG. 7 is a block diagram of a circuit that takes the output of a shift-register as the current vote in the case of a tie.

FIG. 7 is a block diagram of a circuit 701 that takes the output of a shift-register as the current vote in the case of a tie. In the embodiment, an N-stage shift-register (SR) 706 is added, where N is greater than the anticipated largest number of tie votes, whose input is the current vote and whose output is selected as the next vote update in the case of a tie. The SR 706 replaces the inverter or LFSR in the existing approaches. The values within the SR 706 contain a snapshot of the recent vote history for the CDR as it tracks the received clock frequency. Therefore, the SR output is a better estimated vote than simply taking the inverse of the prior vote or a (pseudo) random number because it preserves the PI state history and does not create an instantaneous phase error in the sampling clock.

As illustrated in FIG. 7, the voter 702 receives a clock clk_fsm 712 and N data 710 and/or edge 711 bits that the vote is based on and creates up votes 713 and/or down votes 714 for each of the N bit transitions. The up/down votes are summed 715, 716 and compared 703 and INC 717, the new update to the PI state, is set high to increment the PI state and reduce the PI output frequency or low to decrement the PI state and increase the PI output frequency. The COMPARE 703 block also creates a TIE signal 718 that controls the mux input a multiplexer 704 that drives the final flop 705 (which is clocked by clk 719) to handle the case of a tie vote. The output of the final flop 705 is inc_out 721. Also, the multiplexer 704 select is based on the TIE signal 718, INC 717 is one input to the multiplexer 704 and the other input to the multiplexer 704 is the shift register 706. The shift register 706 may share the same clock 719 as the flip-flop 705. The voter 702 may be implemented in any implementation known in the art, including, but not limited to an implementation that includes a phase detector which may include, but is not limited to, flip-flops and exclusive OR gates.

To demonstrate the effectiveness of the approach in FIG. 7, a behavioral model of a 12.5 GBd SERDES half-rate transmitter and receiver using a PI based CDR was simulated with a time domain simulator. The transmitter and receiver were connected with a model of a backplane with 20 dB of loss at the Nyquist frequency (6.25 GHz). Additionally, a worst-case pattern, consisting of a repeating pseudo-random bit sequence (PRBS) PRBS7+100 1's, was transmitted at 12.5 GBd from the transmitter to the receiver with a 3000 parts-per-million (ppm) frequency offset. Simulations were run using circuit 301, inverting the prior vote in the case of a tie, and circuit 701.

Figure 8:
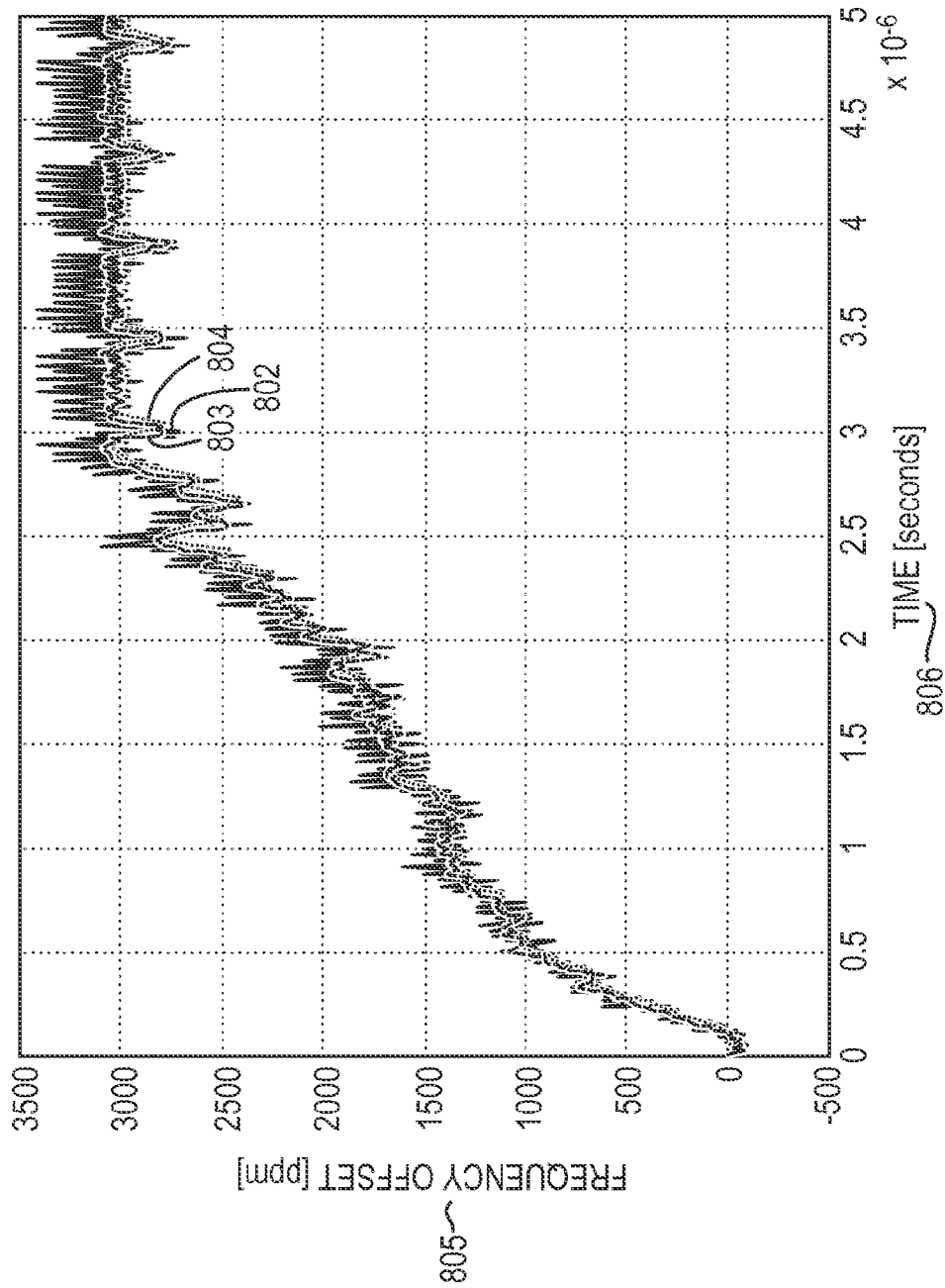
FIG. 8 illustrates the measured frequency offset of a Serializer/Deserializer (SERDES) versus time for repeating pseudo-random bit sequence (PRBS) PRBS7+100CIDs with the inverter of FIG. 3 for a 3000 ppm frequency offset.
Figure 9:
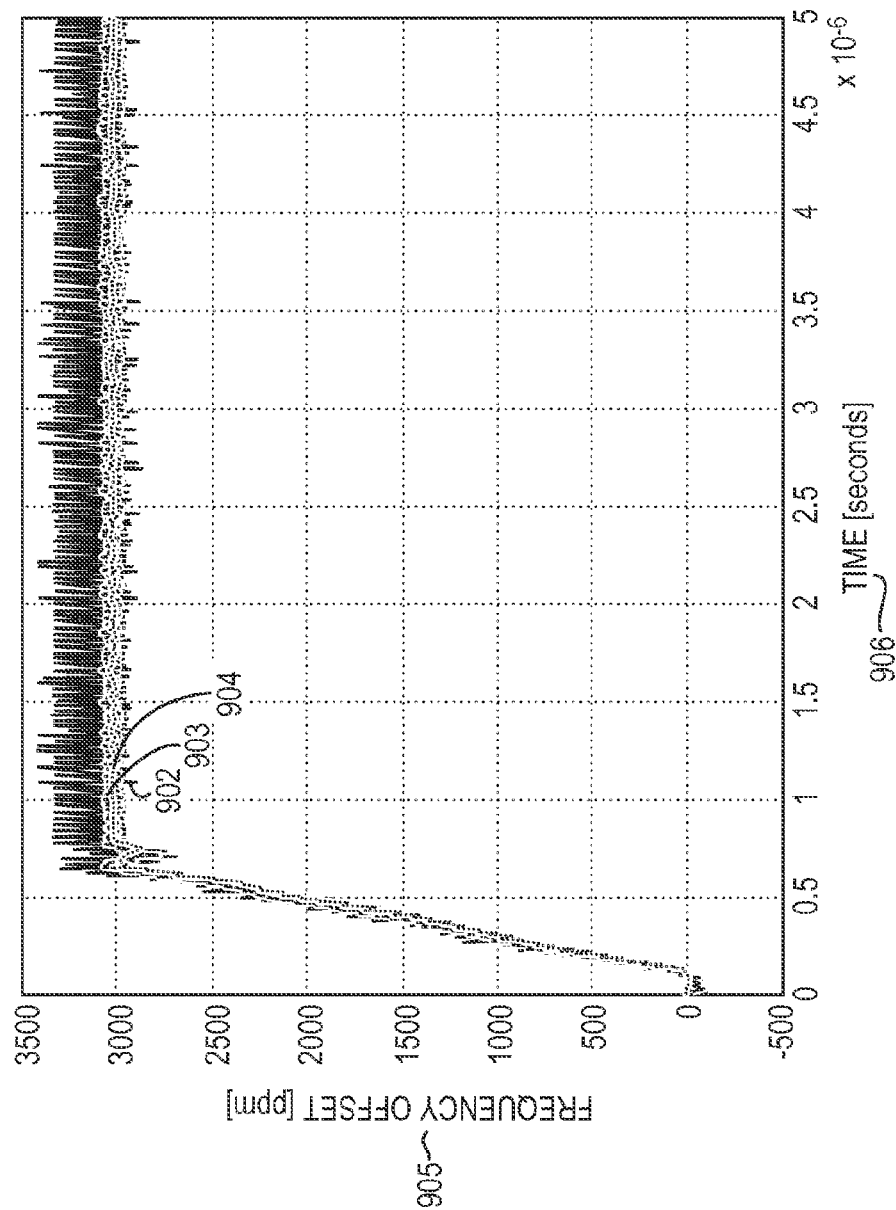
FIG. 9 illustrates the measured Frequency offset of SERDES vs Time for Repeating PRBS7+100CIDs with the shift register of FIG. 7 for a 3000 ppm frequency offset.

FIG. 8 and FIG. 9 show the simulated frequency offset (805, 905, respectively) of the CDR for the two simulations, relative to the receiver's local clock, as a function of simulation time (806, 906, respectively). FIG. 8 represents frequency offset of a SERDES versus time for a repeating pseudo-random bit sequence (PRBS) of PRBS7+100CIDs with the inverter approach of FIG. 3. FIG. 9 represents frequency offset of a SERDES versus time for a repeating pseudo-random bit sequence (PRBS) of PRBS7+100CIDs with the approach of FIG. 7.

In FIG. 8, the outermost curves 802 are the instantaneous simulated frequency offset while the line 803 and the innermost line 804 show the running average of the simulated frequency offset over 100 and 500 FSM clock cycles, respectively. In FIG. 9, the outermost curves in 902 are the instantaneous simulated frequency offset while the line 903 and the innermost line 904 show the running average of the simulated frequency offset over 100 and 500 FSM clock cycles, respectively.

Using the existing approaches, the impact of the 100—consecutive 1's on the simulation using the inverter circuit 301 is visible in FIG. 8. The simulated BER, after the CDR had locked, was 3.72e-2 errors/bit using the known circuit 301 in FIG. 8 and 0 errors/bit (zero) for the circuit 701 in FIG. 9. Additionally, the approach in FIG. 9 greatly improves the CDR lock time compared with existing approaches.

Note that one of ordinary skill in the art appreciates that additional inputs/outputs, and other circuit elements, including, but not limited to, inverters, may be added or removed from the circuits described herein, in order to modify the circuit functionality (data, clocks, or other circuitry) as needed for a given application. Therefore, the present approach is not limited to the exact methods and/or circuits shown herein and may be extended, while still relying upon the concepts of the present approach.

The present approach may be applied to any type of circuit, including, but not limited to, implementations including electronic circuits, semiconductors, integrated circuits, Very Large Scale Integrated Circuits (VLSI ICs), Complementary Metal-Oxide-Semiconductors (CMOS), Application Specific Integrated Circuits (ASICs), circuitry on printed circuit boards (PCBs), microprocessors (also known as "processors"), nanotechnology circuits, and other types of circuits.

While this invention has been particularly shown and described with references to example embodiments thereof, it will be understood by those skilled in the art that various changes in form and details may be made therein without departing from the scope of the invention encompassed by the appended claims.

What is claimed is:

1. A circuit comprising:
a voter having one or more voter inputs, the voter generating, for each given voter input, an up vote indicative of a recovered clock having a negative phase offset relative to the given voter input, or a down vote indicative of the recovered clock having a positive phase offset relative to the given voter input;
a comparator coupled to the voter, the comparator configured to output a phase adjustment signal and a tie signal based upon the up and down votes generated;
a shift register;
a multiplexer coupled to the comparator and the shift register, the multiplexer configured to select either the phase adjustment signal or an output from the shift register as a multiplexer output, based on the tie signal; and
a flip-flop receiving the multiplexer output at a data input of the flip-flop, the flip-flop generating a phase adjustment output signal, the shift register receiving the phase adjustment output signal directly from the flip-flop at a data input of the shift register.

2. The circuit of claim 1, wherein the shift register includes two or more flip-flops.

3. The circuit of claim 1, wherein the voter includes two or more voter inputs.

4. The circuit of claim 1, wherein the shift register includes at least as many flip-flops as a number of the one or more voter inputs.

5. The circuit of claim 1, wherein the shift register includes at least twice as many flip-flops as a number of the one or more voter inputs.

6. The circuit of claim 1, wherein the shift register includes at least as many flip-flops as a number of received consecutive identical values at a given voter input.

7. The circuit of claim 1, wherein the one or more voter inputs comprise one or more data inputs and one or more edge inputs.

8. A circuit comprising:
a shift register;
a multiplexer configured to select either a phase adjustment signal or an output from the shift register, as a multiplexer output based upon a tie signal; and
a flip-flop receiving the multiplexer output at a data input of the flip-flop, the flip-flop generating a phase adjustment output signal, the shift register receiving the phase adjustment output signal directly from the flip-flop at a data input of the shift register.

9. The circuit of claim 8, further comprising a voting module having one or more voter inputs, the voting module generating the tie signal and the phase adjustment signal based upon a majority vote of phase offset for the one or more voter inputs relative to a recovered clock.

10. The circuit of claim 8, wherein the shift register includes two or more flip-flops.

11. The circuit of claim 9, wherein the voting module includes two or more voter inputs.

12. The circuit of claim 9, wherein the shift register includes at least as many flip-flops as a number of the one or more voter inputs.

13. The circuit of claim 9, wherein the shift register includes at least twice as many flip-flops as a number of the one or more voter inputs.

14. The circuit of claim 9, wherein the shift register includes at least as many flip-flops as a number of received consecutive identical values at a given voter input.

15. The circuit of claim 9, wherein the one or more voter inputs comprise one or more data inputs and one or more edge inputs.

16. A method comprising:
selecting, at a multiplexer, either a phase adjustment signal or an output from a shift register, as a multiplexer output based upon a tie signal; and
receiving, at a flip-flop, the multiplexer output at a data input of the flip-flop, the flip-flop generating a phase adjustment output signal, the shift register receiving the phase adjustment output signal directly from the flip-flop at a data input of the shift register.

17. The method of claim 16, further comprising generating, at a voting module, the tie signal and the phase adjustment signal based upon a majority vote of phase offset for the one or more voter inputs of the voting module relative to a recovered clock.

18. The method of claim 16, wherein the shift register includes two or more flip-flops.

19. The method of claim 17, wherein the shift register includes at least as many flip-flops as a number of the one or more voter inputs.

20. The method of claim 17, wherein the one or more voter inputs comprise one or more data inputs and one or more edge inputs.

21. The method of claim 17, wherein the shift register includes at least as many flip-flops as a number of received consecutive identical values at a given voter input.

22. A method comprising:
receiving bit transition information for one or more bits;
determining whether to increment, decrement, or keep unchanged a phase relationship of a phase interpolator, based upon the bit transition information;
generating a phase adjustment output, based upon the determination; and
storing one or more sequential values of the phase adjustment output, the phase adjustment output generated directly from the stored sequential values of the phase adjustment output when the phase relationship is determined as unchanged;
wherein the phase relationship determined as kept unchanged is indicative of a recovered clock being locked to the bit transition information and indicative of the bit transition information being unavailable.

* * * * *